(12) United States Patent
Kurihara

(10) Patent No.: US 6,208,017 B1
(45) Date of Patent: Mar. 27, 2001

(54) SEMICONDUCTOR DEVICE WITH LEAD-ON-CHIP STRUCTURE

(75) Inventor: Kenichi Kurihara, Tokyo (JP)

(73) Assignee: NEC Corporation, Tokyo (JP)

( * ) Notice: Subject to any disclaimer, the term of this patent is extended or adjusted under 35 U.S.C. 154(b) by 697 days.

(21) Appl. No.: 08/539,069

(22) Filed: Oct. 4, 1995

(30) Foreign Application Priority Data

Oct. 7, 1994 (JP) .................................................. 6-270308

(51) Int. Cl.[7] ................................................. H01L 23/495
(52) U.S. Cl. ........................... 257/666; 257/669; 257/692
(58) Field of Search .................................. 257/666, 667, 257/669, 692, 696, 784

(56) References Cited

U.S. PATENT DOCUMENTS

| | | | |
|---|---|---|---|
| 5,137,479 | * 8/1992 | Ohikata et al. | 257/666 |
| 5,352,139 | * 10/1994 | Yaguchi et al. | 257/670 |
| 5,455,200 | * 10/1995 | Bigler et al. | 257/666 |

FOREIGN PATENT DOCUMENTS

| | | | |
|---|---|---|---|
| 1-135055 | 5/1989 | (JP) . | |
| 1-276655 | 11/1989 | (JP) . | |
| 2018956 | * 1/1990 | (JP) | 257/669 |
| 4165661 | * 6/1992 | (JP) | 257/669 |

* cited by examiner

*Primary Examiner*—Roy Potter
(74) *Attorney, Agent, or Firm*—Young & Thompson

(57) ABSTRACT

A semiconductor chip is bonded to lead terminals via insulating layers. The semiconductor chip is electrically connected to the lead terminals in bonding parts on the tip of inner leads by bonding wires, respectively. Indentation having smaller width than that of the bonding parts are provided in the portion where the lead terminal is bonded to the insulating layer. A bent part is provided in the lead terminal is bonded to the insulating layer. Sealing the semiconductor chip, the lead terminals, the insulating films and the bonding wires by resin, a semiconductor device is completed.

6 Claims, 6 Drawing Sheets

SEMICONDUCTOR DEVICE WITH LEAD-ON-CHIP STRUCTURE

BACKGROUND OF THE INVENTION

The present invention relates to a semiconductor device in which a semiconductor chip and a lead frame bonded thereto via an insulating film are sealed with a resin and, more particularly, to a semiconductor device in which a semiconductor chip is mounted on the inner lead parts of a lead frame via an insulating layer.

Along with miniaturization and low profiling of semiconductor devices, lead frames with lead-on-chip (LOC) structure has been proposed. In the prior art LOC structure, a semiconductor chip is stuck on the rear surface of a lead frame using an insulating layer having an adhesive coating on both sides of an insulating film. A polyimide coating is given in the space between the semiconductor chip and the adhesive of the insulating layer. The semiconductor chip is electrically connected to the lead frame by means of bonding wires. The entire system is then sealed with a resin.

In the bonding part of the lead frame of this LOC structure, the lead frame is bonded onto the insulating layer, and the bonding part of the lead frame is electrically connected to the semiconductor chip by means of a bonding wire. In the bonding part of the prior art LOC structure as described above, the width of the inner lead is being enlarged in order to secure a wider area of bonding to the insulating layer.

In a semiconductor device employing a lead frame with the prior art LOC structure, there is a problem in that, during temperature cycling, peeling originates between the resin and the vicinity of the bonding part of the inner lead due to the difference in thermal expansion of various component members, and a crack developed with the peeling as the starting point reaches the bonding wire to break the bonding wire.

SUMMARY OF THE INVENTION

It is therefore the object of the present invention to provide a semiconductor device having a high bonding strength between a lead terminal bonded to a semiconductor chip via an insulating film.

A semiconductor device according to the present invention, comprises: a semiconductor chip; an insulating layer formed on said semiconductor chip; at least one lead provided for said semiconductor chip, said lead terminal frame having a bonding part adhered to a surface of said insulating film and an inner lead having first and second portions, said first portion of said inner lead connected to said bonding part and adhered to said surface of said insulating film, said first portion of said inner lead including a partially bent portion, said second portion of said inner lead being elongated from said first portion of said inner lead and apart from said insulating film; a bonding wire electrically connecting between said bonding part of said lead terminal and said semiconductor chip; and a mold sealing said semiconductor chip, said insulating film, said bonding part of said lead frame and said bonding wire.

In another aspect, a semiconductor device according to the present invention, comprises: a semiconductor chip; an insulating layer formed on said semiconductor chip; at least one lead terminal provided for said semiconductor chip, said lead terminal having an bonding part adhered to a surface of said insulating film and an inner lead elongated from said bonding part; a bonding wire electrically connecting between said bonding part of said lead terminal and said semiconductor chip; and a mold resin sealing said semiconductor chip, said insulating film, said bonding part of said lead frame and said bonding wire; said lead terminal further has an indented part including first and second portions, said first portion having narrower width than said bonding part, and said second portion having wider width than said first portion of and connected to said bonding part via said first portion.

In this invention, the bonding strength between the semiconductor chip and the lead terminal bonded thereto via the insulating film, and the bite of these components on the resin, can be improved, and the relative displacement of the component members can be reduced, by the formation of parts, with width narrower than that of the bonding parts, in the portions of the lead terminal where it is bonded to the insulating film, namely, by the formation of projected parts or indented parts on the tip of the inner leads and in the vicinity of the bonding parts halfway to the tips, of the lead terminal. In this way, breaking of the bonding wires due to temperature cycling can be prevented, and an excellent effect even compared with the conventional case of employing through holes can be obtained by giving narrow parts to the inner leads. In addition, this invention has an effect of preventing adverse effects of grown peelings on the bonding parts.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENT

Figure 1:
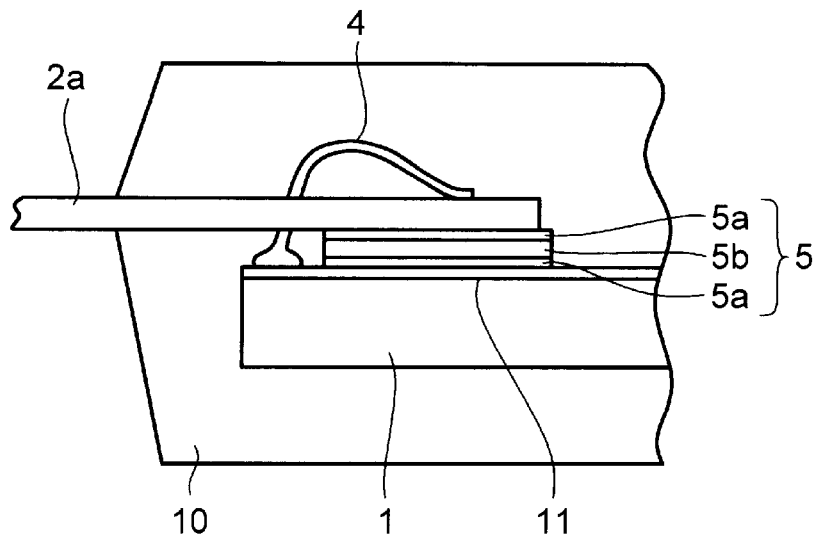
FIG. 1 is a partial sectional view showing a semiconductor device of conventional LOC structure.

Prior to the presentation of an embodiment according to this invention, the prior art will be described in detail by referring to the drawings.

As shown in FIG. 1, in the prior art LOC structure, a semiconductor chip 1 is stuck on the rear surface of a lead frame 2a using an insulating layer 5 having an adhesive 5a coated on both sides of an insulating film 5b. A polyimide coating 11 is given in the space between the semiconductor chip 1 and the adhesive 5a of the insulating layer 5. The semiconductor chip 1 is electrically connected to the lead frame 2a by means of bonding wires 4. Then, the entire system is sealed with a resin 10.

Figure 2:
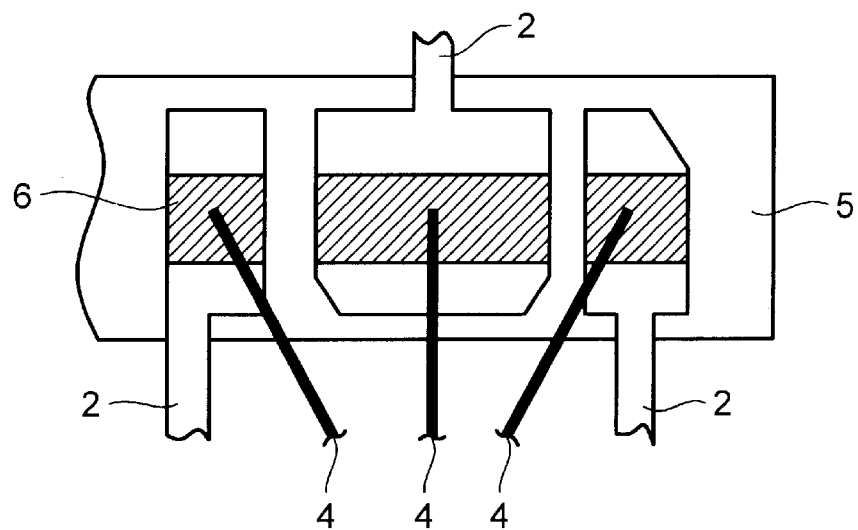
FIG. 2 is a partial plan view of the semiconductor device in FIG. 1.

As shown in FIG. 2, in the bonding part of the lead frame of the LOC structure, the lead frame is bonded to the insulating layer 5 and the bonding parts 6 of the lead frame are electrically connected to the semiconductor chip by means of the bonding wires 4. In the bonding parts 6 of the prior art LOC structure described as in the above, the inner leads are made wide in order to secure a large bonding area with the insulating layer 5.

In a semiconductor device employing the lead frame of prior art LOC structure as described in the above, there is a problem of breakage of bonding wire 4 in which, a peeling from the resin 10 takes place during the temperature cycling in the vicinity of the bonding part 6 of the inner lead 2, and a crack develops with the peeling as the starting point, which reaches and breaks the bonding wire 4.

The mechanism of the bonding wire breakage will be described with reference to FIG. 4(a) to FIG. 4(d). As shown in FIG. 4(a) to FIG. 4(d), the semiconductor chip 1 is stuck to the inner lead 2 of the lead frame 2a via the insulating layer 5, and the semiconductor chip 1 is electrically connected to the lead frame 2a by means of the bonding wire 4. Then, the entire, system is sealed with the resin 10.

Figure 4A:
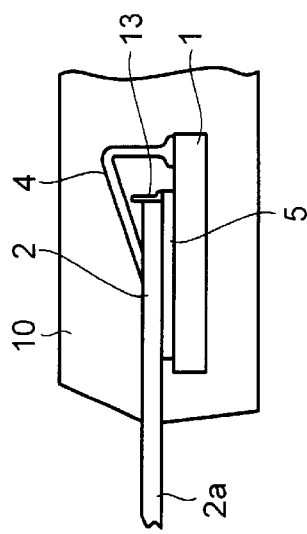
FIG. 4 is a partial sectional view for describing the breaking mechanism of the bonding wire.
Figure 4B:
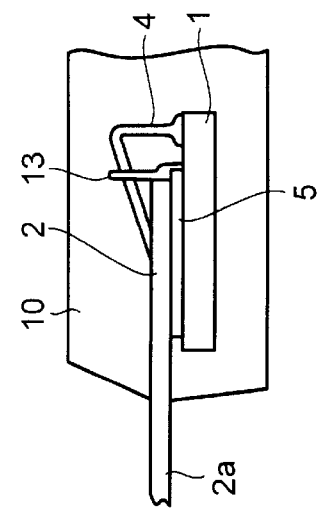
Figure 4C:
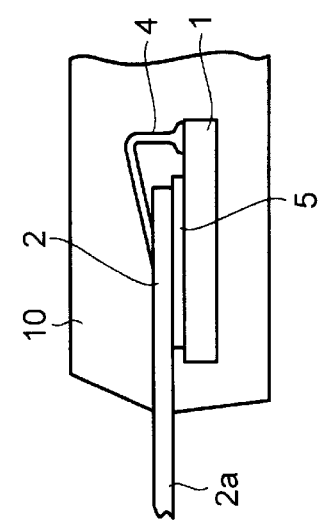
Figure 4D:
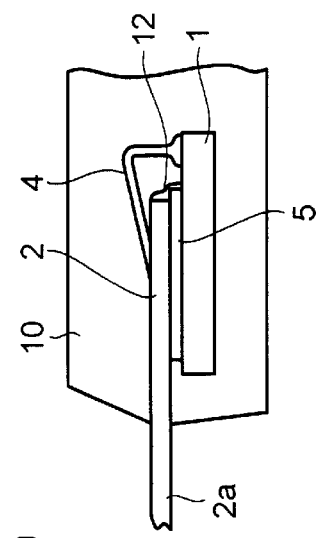

FIG. 4(a) shows the state prior to the temperature cycling, where neither peeling nor crack is in existence. FIG. 4(b) shows the state during the temperature cycling, where a peeling 12 of the tip of the inner lead 2 from the sealing resin 10 is taking place due to expansion and contraction of the inner lead 2. FIG. 4(c) shows the state when the temperature cycling progresses further, where a crack 13 occurred caused by the peeling 12. FIG. 4(d) shows the state when the temperature cycling has made still further processes, where the crack 13 grows with the progress in the temperature cycling until it breaks the bonding wire 4.

In order to resolve the above problem, a method of forming a through hole at the root of the inner lead is proposed in Japanese Laid-Open Patent Application No. Hei 1-135055. However, this method of forming a through hole at the root of the inner lead requires at least about 0.5 mm for the width of the lead so that it is possible to apply the method to the vicinity of the bonding parts where the lead pitch becomes high.

Figure 3:
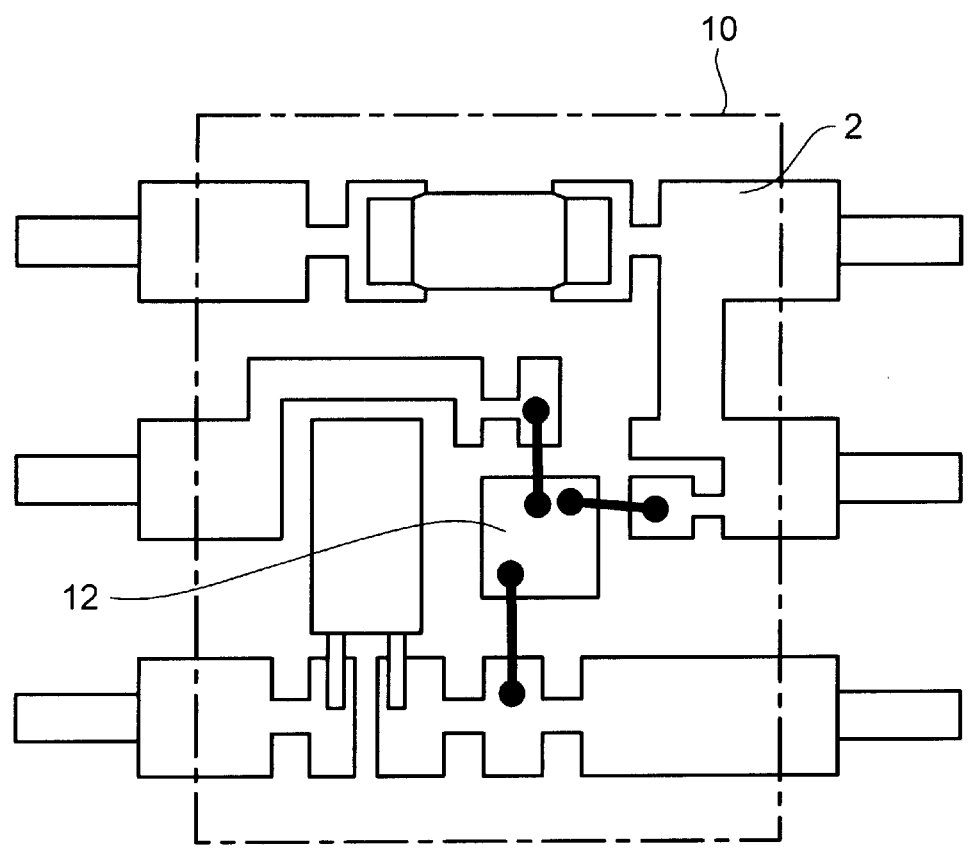
FIG. 3 is a see-through plan view of the prior art semiconductor device.

Besides, an example of narrowing parts of the lead frame is disclosed in Japanese Laid-Open Patent Application No. Hei 1-276655. This is a method related to a transfer mold type integrated circuit, and, as shown in FIG. 3, deals with a device in which an electronic component 12 connected to the inner leads 2 is sealed with a mold 10, where the lead frame has a smaller sectional area in the vicinity of the junction part with the electronic component 11, such as a chip capacitor or a chip resistor, than that of the other components. This method is intended to reduce the stress on the electronic component 11 connected to the inner leads 2.

However, the device shown in FIG. 3 is basically different from a semiconductor device of LOC structure which is obtained by resin-sealing a semiconductor chip, a lead frame bonded to the semiconductor chip via an insulating film, and bonding parts electrically connecting the semiconductor chip to the lead frame by means of wires. It is different from a device aimed at preventing peeling from the sealing resin of the component members in the vicinity of the bonding parts. Moreover, the attempt to apply the present prior art to LOC structure requires the covering of the insulating layer 5 with the inner leads to a maximum extent possible for the reason that the inner leads used for LOC structure tend to peel off the insulating layer 5 and the resin 10, so that the method cannot be applied to the LOC structure without appropriate modifications.

Next, referring to the drawings, an embodiment of this invention will be described.

Figure 5:
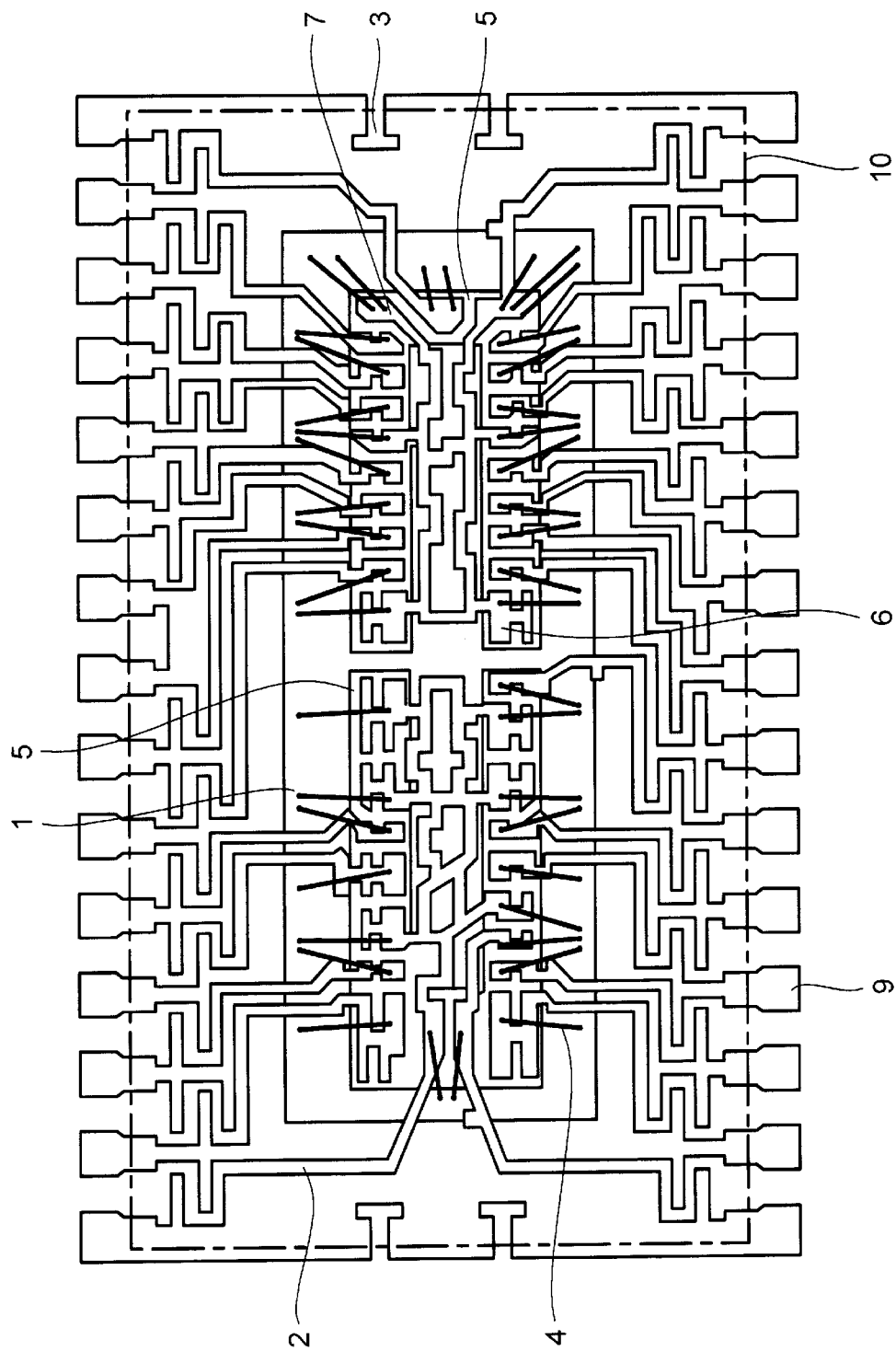
FIG. 5 is a see-through plan view of an embodiment of the semiconductor device according to the present invention.

FIG. 5 shows an embodiment of the semiconductor device according to this invention in which a semiconductor chip 1 is bonded to the lead terminals via two U-shaped insulating layers 5. The semiconductor chip 1 is electrically connected to the lead terminal in bonding parts 6 on the tip of inner leads 2 by means of bonding wires 4. Indentations 7 having smaller width than that of the bonding parts 6 are provided in the portion where the lead terminal is bonded to the insulating layer 5. In the figure, 3 is a suspension pin, 10 is a mold, and 9 is a tie bar part.

Figure 6:
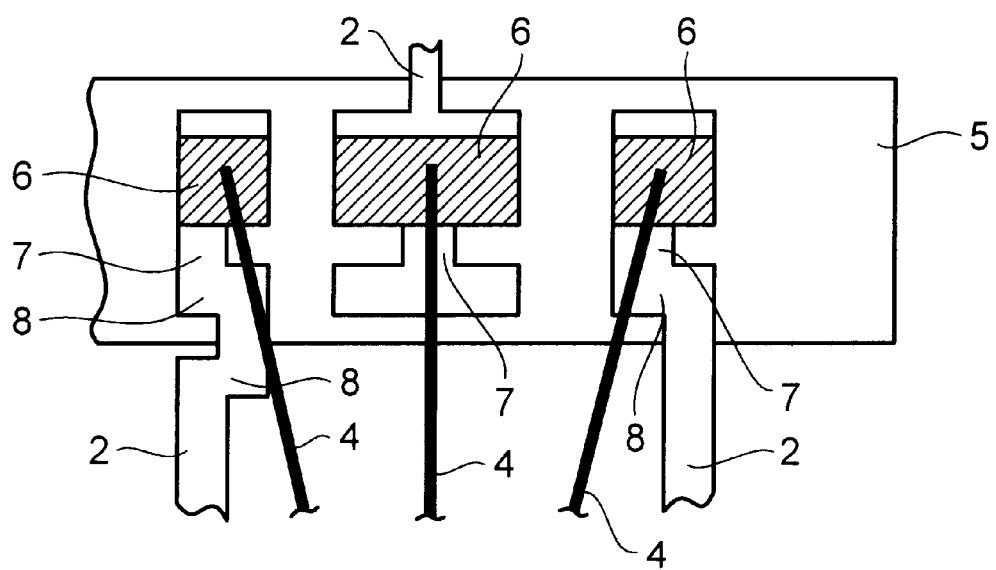
FIG. 6 is a partial plan view for describing a first feature of the semiconductor device in FIG. 5.

FIG. 6 is a diagram for describing a first feature of the device in FIG. 5, which is an enlarged view (schematic view) of a part of the device in FIG. 5.

In this part of the device, the semiconductor chip 1 is fixed by bonding to the rear surface of the lead terminal via an insulating layer 5, and parts 7 having smaller width than that of the bonding parts 6 are formed in the parts of the lead terminal bonded to the insulating film 5, that is, in the bonding parts 6 on the tip of the inner leads 2. In the structure on the left-hand side of FIG. 6, a part 7 narrower than the bonding part 6 and a bent part 8 are formed in the portion of the inner lead 2 bonded to the insulating layer 5. Moreover, another bent part 8 is formed without being adhered to the insulating layer 5. In the structure at the center of FIG. 6, indentations 7 are formed in the part on the tip of the inner lead 2 beyond the bonding part 6, and in the structure on the right-hand side of FIG. 6, a bent part 8 and an indented part 7 are formed in the inner lead 2 on the insulating layer 5.

By forming indentations 7 as in the above in the bonding parts 6 on the tip of the inner leads 2, a structure can be obtained in which the adhesion and the biting, of the parts of the lead terminal bonded to the insulating film 5, to the adhesive 5a and the resin 10 are improved. In this way, displacement of the various component members in the vicinity of the bonding parts 6 of the inner leads 2 can be reduced by about 70%, and the peeling between the various component members can be prevented.

Next, referring to FIG. 7, a second feature of the device in FIG. 5 will be described.

Figure 7:
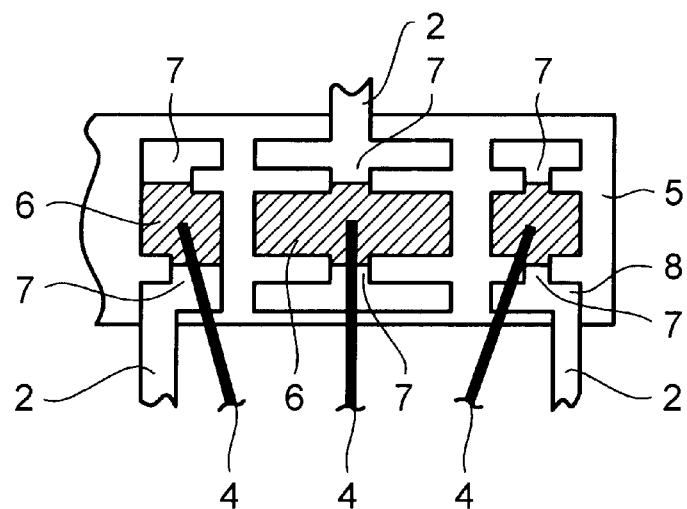
FIG. 7 is a partial plan view for describing a second feature of the semiconductor device in FIG. 5.

In FIG. 7, the structure on the left-hand side of the figure has an indentations 7 pinchinging the bonding part 6 in the part bonded to the insulating layer 5 on the tip of the inner lead 2, the structure at the center has two indented parts 7 in each side of the bonding part 6 on the tip of the inner lead 2, while the structure on the right-hand side has two indented parts 7 in the bonding part 6 on the tip of the inner lead 2 and a bent part in the part bonded to the insulating layer 5.

As in the above, by forming indentations 7 so as to nip the bonding parts 6 on the tip of the inner leads 2, it is possible to reduce the displacements of the various component members in the vicinity of the bonding parts 6 caused by the difference in thermal expansion by about 80 to 90%.

Figure 8:
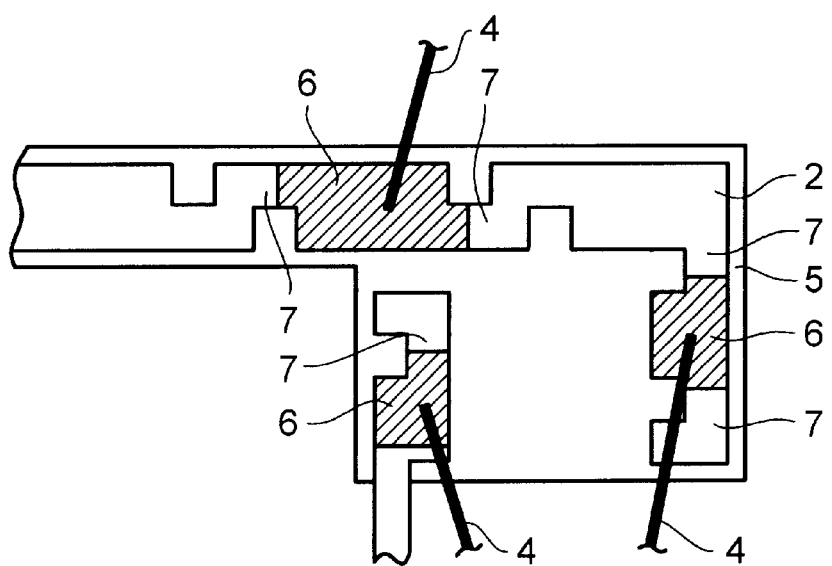
FIG. 8 is a partial plan view for describing a third feature of the semiconductor device in FIG. 5.

Next, referring to FIG. 8, a third feature of the device in FIG. 5 will be described.

This figure shows a structure in which a semiconductor chip is stuck on the rear surface of the inner leads 2 via an insulating layer 5. When there exists a bonding part 6 halfway to the tip of the inner lead 2, indentations 7 are formed by forming indented parts 7 in the vicinity of the bonding part 6. By so doing, the displacement due to the difference in thermal expansion at the bonding part 6 can be reduced by about 80%, and the breakage of the bonding wires 4 can be prevented by blocking the propagation of the peelings generated on the inner leads 2 by the indentations.

As in the above, the breakage of the bonding wires 4 can be prevented by precluding the generation of cracks caused by the peelings. For example, the number of wire breakage failure due to temperature cycling was 0/20 for T/C of 1000 cycles for an LOC package according to the present invention, with no wire breakage failure due to temperature cycling, in contrast to 2/20 for T/C of 700 cycles for a conventional LOC package.

Although the invention has been described with reference to a specific embodiment, the invention is not meant to be construed in a limiting sense. Various modifications of the disclosed embodiments will become apparent to persons skilled in the art upon reference to the description of the invention. It is therefore contemplated that the appended claims will cover any modifications or embodiments as fall within the scope of the invention.

What is claimed is:

1. A semiconductor device comprising: a semiconductor chip having at least one bonding pad; an insulating layer selectively formed on said semiconductor chip; at least one lead terminal provided for said at least one bonding pad, said at least one lead terminal including a bonding part adhered to said insulating layer and an inner lead, said inner lead having a first portion projecting from said insulating layer toward said bonding pad and a second portion disposed between said bonding part and said first portion and adhered to said insulating layer; said second portion extending from said bonding part in a first direction toward said first portion with a width that is smaller than a width of said bonding part, and having a first bent segment on said insulating layer extending in a second direction perpendicular to said first direction and a second bent segment on said insulating layer extending in said first direction and joining said first portion; and at least one bonding wire connecting said at least one bonding pad to said bonding part of said at least one lead terminal.

2. The device as claimed in claim 1, wherein said first and second bent segments are positioned such that a part of said insulating layer appears between said bonding part and said second portion, and said at least one bonding wire passes over said part of said insulating layer.

3. A semiconductor device comprising: a semiconductor chip having at least one bonding pad; an insulating layer selectively formed on said semiconductor chip; at least one lead terminal provided for said at least one bonding pad; said at least one lead terminal including a bonding part adhered to said insulating layer and an inner lead extending from said bonding part and projecting from said insulating layer in a first direction away from said at least one bonding pad; said at least one lead terminal further including a first portion extending from said bonding part in said second direction opposite said first direction with a width that is narrower than a width of said bonding part and a second portion extending from an end part of said first portion in a third direction perpendicular to said second direction, each of said first and second portions being adhered to said insulating layer; and at least one bonding wire connecting said bonding part of said at least one lead terminal to said at least one bonding pad.

4. The device as claimed in claim 3, wherein said at least one lead terminal further includes a third portion extending from the end part of said first portion ir a fourth direction opposite to said third direction, said third portion being adhered to said insulating layer.

5. A semiconductor device comprising: a semiconductor chip having first and second bonding pads arranged in-line in a first direction; and insulating layer selectively formed on said semiconductor chip along said first and second bonding pads; a first lead terminal provided for said first bonding pad; said first lead terminal including a first bonding part which is adhered to said insulating layer, a first inner lead which has a first portion adhered to said insulating layer and elongated from said bonding part and a second portion extending from said first portion and projecting from said insulating layer in a second direction toward said first bonding pad, said second direction being transverse to said first direction, and a cut-off portion which is provided in a part of said first portion to expose a part of said insulating layer between said first bonding part and a remaining part of said first portion; a second lead terminal provided for said second bonding pad, said second lead terminal including a second bonding part which is adhered to said insulating layer, a second inner lead which extends from said second bonding part and projects from said insulating layer in a third direction opposite to said second direction, and an additional portion which is adhered to said insulating layer and extends from said second bonding part in said second direction and is thereafter bent in said first direction; a first bonding wire connecting said first bonding part of said first lead terminal to said first bonding pad; and a second bonding wire connecting said second bonding part of said second lead terminal to said second bonding pad.

6. The device as claimed in claim 5, wherein said first bonding wire passes over said part of said insulating layer exposed by said cut-off portion.

* * * * *